(12) United States Patent
Renau et al.

(10) Patent No.: US 7,250,617 B2
(45) Date of Patent: Jul. 31, 2007

(54) ION BEAM NEUTRAL DETECTION

(75) Inventors: Anthony Renau, West Newbury, MA (US); Joseph C. Olson, Beverly, MA (US); Eric Hermanson, Georgetown, MA (US); Gordon C. Angel, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/056,445

(22) Filed: Feb. 11, 2005

(65) Prior Publication Data

US 2005/0178981 A1    Aug. 18, 2005

Related U.S. Application Data

(60) Provisional application No. 60/544,029, filed on Feb. 12, 2004.

(51) Int. Cl.
*H01J 37/08* (2006.01)

(52) U.S. Cl. .............. 250/492.21; 250/251; 250/492.2; 250/397

(58) Field of Classification Search ........... 250/492.21, 250/370.05, 492.3
See application file for complete search history.

(56) References Cited

U.S. PATENT DOCUMENTS

| | | | | |
|---|---|---|---|---|
| 5,543,615 A | * | 8/1996 | Saito et al. | 250/251 |
| 5,631,461 A | * | 5/1997 | Swenson | 250/251 |
| 5,811,823 A | * | 9/1998 | Blake et al. | 250/492.21 |
| 5,814,823 A | * | 9/1998 | Benveniste | 250/492.21 |
| 5,883,391 A | * | 3/1999 | Adibi et al. | 250/492.21 |
| 6,207,958 B1 | * | 3/2001 | Giakos | 250/385.1 |

\* cited by examiner

*Primary Examiner*—Jack I. Berman
*Assistant Examiner*—Zia R. Hashmi

(57) ABSTRACT

An ion beam neutral detector system, an ion implanter system including the detector system and a method of detecting ion beam neutrals that ensures an ion implant is meeting contamination requirements are disclosed. The detector includes an energy contamination monitor positioned with in an ion implanter system. A method of the invention includes implanting the workpiece using an ion beam, and periodically detecting ion beam neutrals in the ion beam such that adjustments to the ion implanter system can be made for optimization.

24 Claims, 5 Drawing Sheets

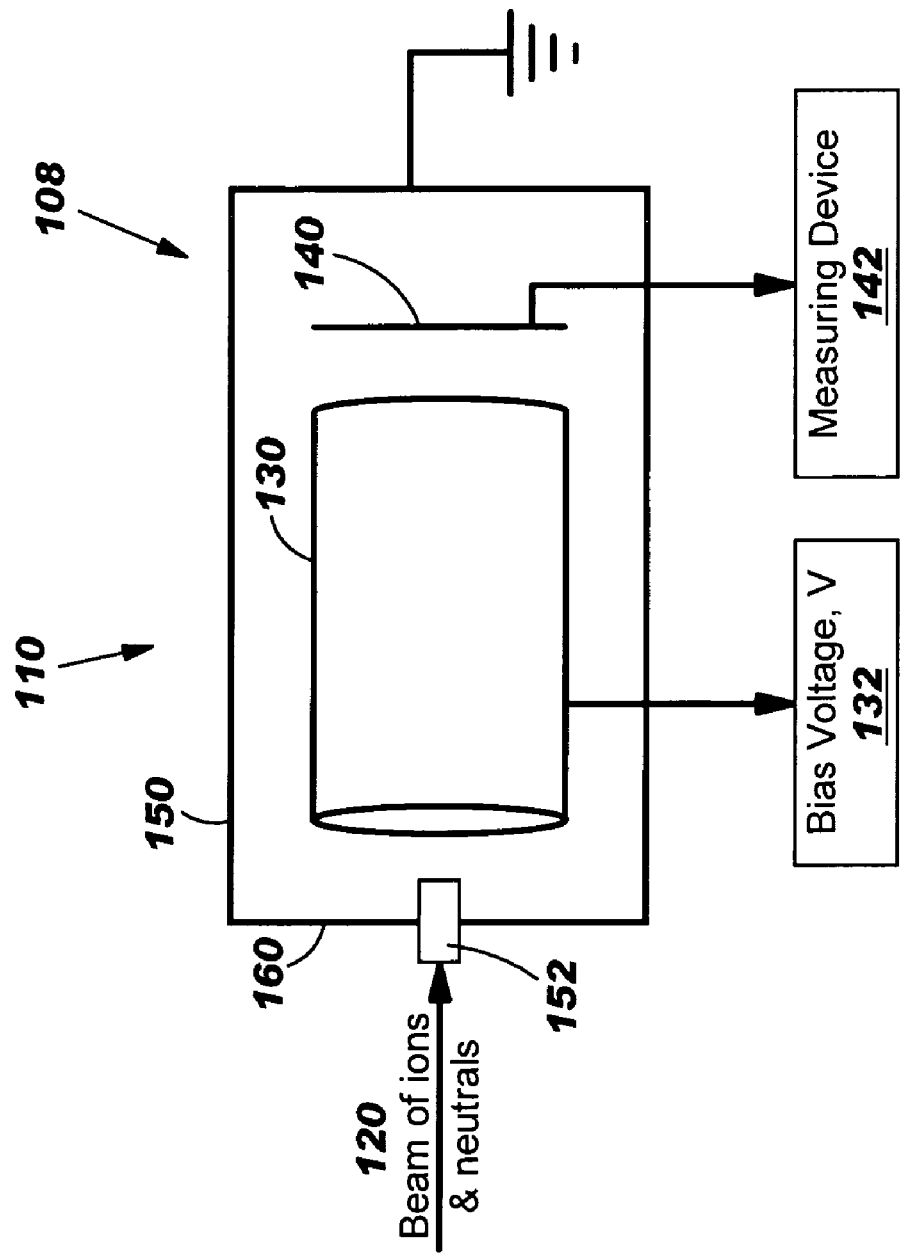

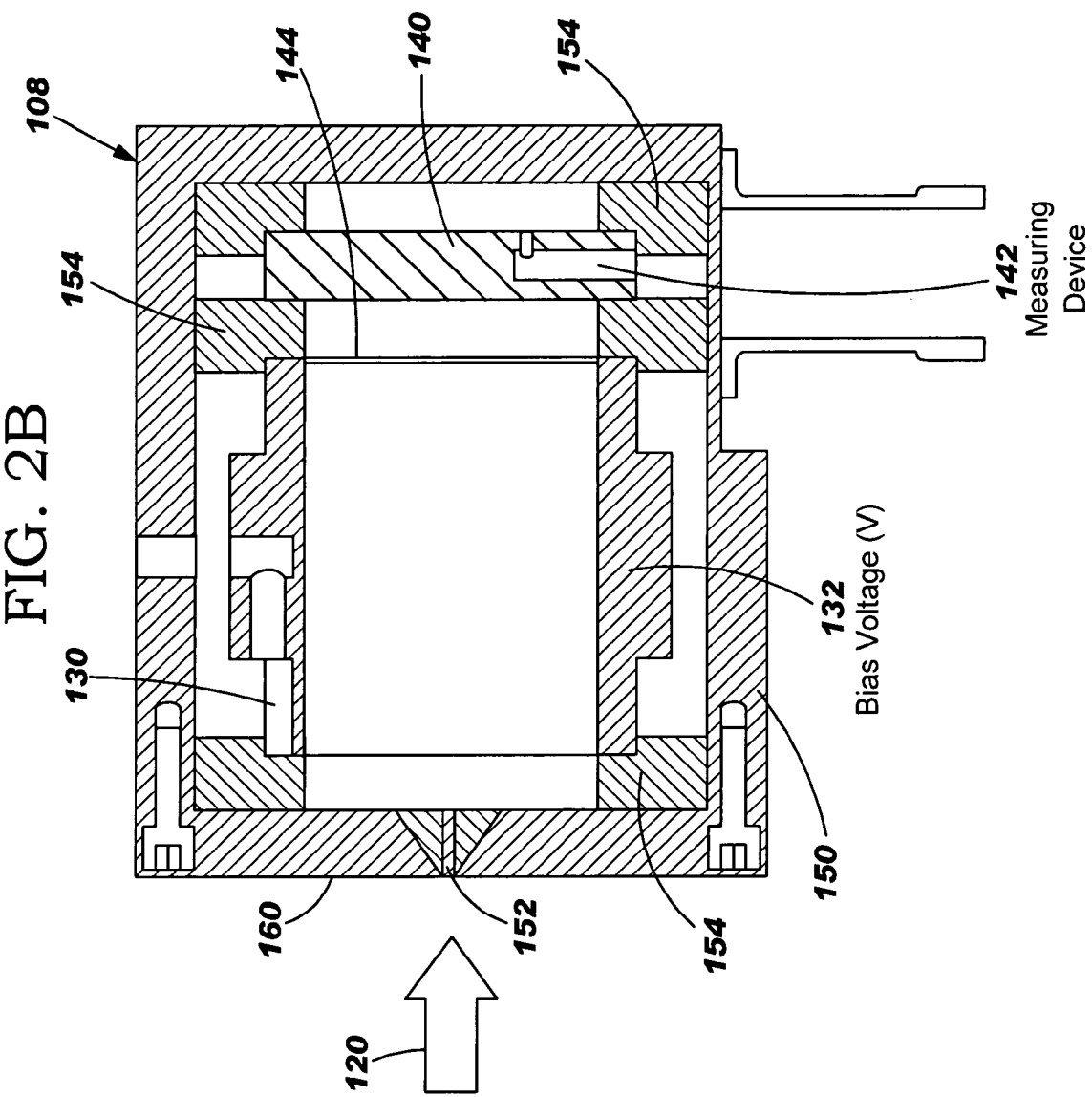

ION BEAM NEUTRAL DETECTION

CLAIM OF PRIORITY

The present invention claims benefit of U.S. Provisional Application Ser. No. 60/544,029 filed on Feb. 12, 2004, entitled, "ION BEAM NEUTRAL DETECTION."

BACKGROUND OF THE INVENTION

1. Field of the Invention

The described apparatus and methods relate to detecting energetic neutrals of an ion beam. More particularly, the described apparatus and methods are directed for detecting neutrals of an ion beam in an ion implanter to minimize and prevent energy contamination of a workpiece.

2. Related Art

Deceleration of an ion beam reasonably close to a workpiece, such as a wafer, is a standard method of improving ion implanter productivity for low energy beams. The main benefit of deceleration is to reduce the distance the beam must travel at low energy where the efficiency of transporting the beam is poor. The closer the deceleration is to the workpiece, the more benefits result as far as increasing the beam current. However, ions that become neutral prior to the deceleration, but within a line of sight of the wafer, will be implanted at their undecelerated energy and are classified as energy contamination. FIG. 1 illustrates how energy contamination may occur in an ion implanter. As an ion beam 10 propagates through the implanter, a bend magnet 12 may direct beam 10 toward drift space 14. In drift space 14, collisions with surfaces and background gas produce energetic neutrals. Through a deceleration stage 16, ions are decelerated to a final energy in one portion 18 of beam 10. A small flux of the higher energy neutrals remain as a second portion 20 of beam 10. The neutrals that pass to a wafer 22 will implant significantly deeper than the ions to cause energy contamination. Only a small amount of energy contaminated ions are allowed to be implanted, typically on the order of 0.2% to 0.5%, before the implantation of the workpiece is adversely effected.

Known techniques for limiting energy contamination include an implanter architecture where an electrostatic or magnetic bend is placed between the deceleration stage and the magnet, increased pumping to limit the neutralization of beam ions by residual gas, an aperture and liner design to prevent neutrals formed by collisions with the structures inside the implanter from reaching the workpiece, and limiting the voltage allowed when running deceleration to reduce the implanted depth of the contaminant ions. The implanter may be designed to produce zero energy contamination by extracting the required low energy beams directly from the source, but this inherently runs at much lower beam currents. The other techniques allow for higher currents but do not provide any real time monitoring to ensure that they are effective in preventing energy contamination every time the implanter is run.

In view of the foregoing, it is desired to ensure that the implanter is meeting this contamination requirement at all times while the implantation productivity is maximized.

SUMMARY OF THE INVENTION

The invention includes an ion beam neutral detector system, an ion implanter system including the detector system and a method of detecting ion beam neutrals that ensures an ion implant is meeting contamination requirements. The detector includes an energy contamination monitor positioned within an ion implanter system. A method of the invention includes implanting the workpiece using an ion beam, and periodically detecting ion beam neutrals in the ion beam such that adjustments to the ion implanter system can be made for optimization.

A first aspect of the invention is directed to an ion implanter system comprising: a source for generating an ion beam for implanting a workpiece; and an ion beam neutral detector.

A second aspect of the invention is directed to a method of implanting a workpiece with an ion implanter system, the method comprising the steps of: implanting the workpiece using an ion beam; and periodically detecting ion beam neutrals in the ion beam.

A third aspect of the invention is directed to an ion beam neutral detector system comprising: a detection structure including: a chamber coupled to a bias voltage, a collector plate adjacent the chamber for receiving the ion beam, and a measuring device that measures a current at the collector plate.

The foregoing and other features of the invention will be apparent from the following more particular description of embodiments of the invention.

BRIEF DESCRIPTION OF THE DRAWINGS

For a better understanding of the present invention, reference is made to the accompanying drawings, which are incorporated herein by reference and in which:

FIG. 2A is a schematic diagram of an energy contamination monitor according to an embodiment of the present invention;

FIG. 2B is a cross sectional view of an energy contamination monitor according to an embodiment of the present invention;

DESCRIPTION OF THE INVENTION

Figure 1:
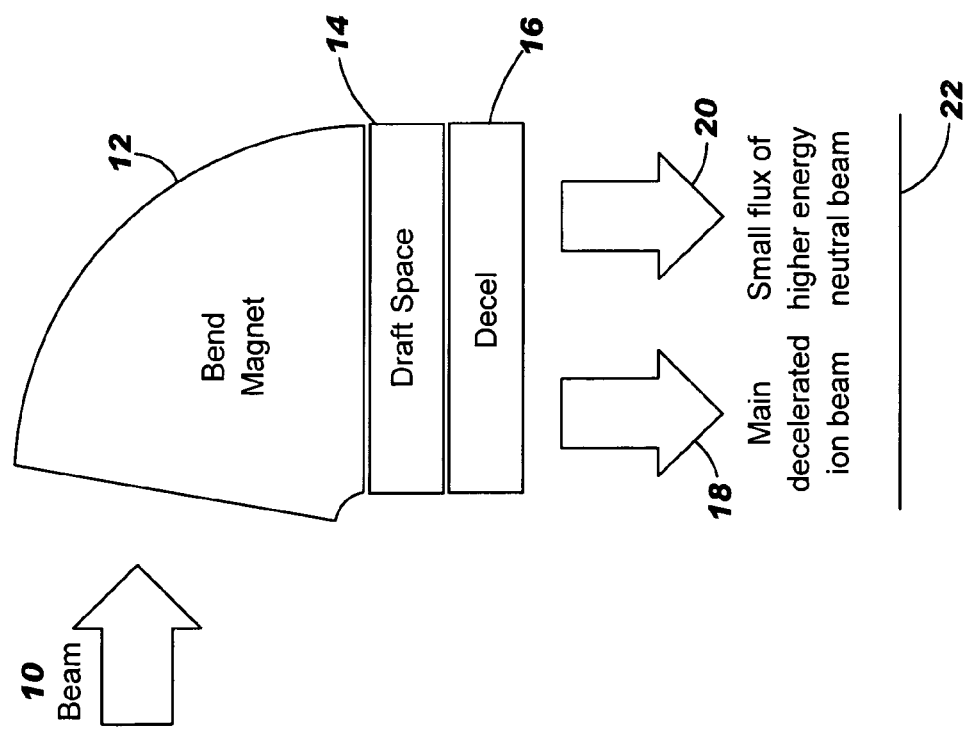
FIG. 1 illustrates an ion beam path in a conventional ion implantation system.

Embodiments of the present invention are directed to methods and apparatus for measuring the current of secondary electrons emitted due to the impact of the energetic neutral particles. FIG. 2A illustrates a schematic diagram and FIG. 2B illustrates a cross sectional view of a detection structure 108 of an energy contamination monitor 110 (also referred to herein as an "ion beam neutral detector system") according to embodiments of the present invention. Detection structure 108 includes: a chamber 130, a collector plate 140 and a measuring device 142. A container 150 may be provided to house and position collector plate 140 adjacent chamber 130 for receiving ion beam 120, as will be described in more detail below. In addition, as shown in FIG. 2B, a mesh filter 144 is electrically connected to chamber 130 may be provided in front of collector plate 140. Mesh filter 144 may include, for example, tungsten or tantalum.

As shown in FIGS. 2A-2B, ion beam 120 of ions and neutrals enters container 150 through an aperture 152 in a shield 160, which is coupled to container 150. In one embodiment, detection structure 108 is substantially cylindrical in shape, although this is not necessary. In this case, however, chamber 130 is substantially cylindrical and collector plate 140 is substantially circular. Chamber 130 is connected to a bias voltage supply 132 and collector plate 140 is connected to measuring device 142, which measures the collector current $I_{col}$ (FIG. 3) at collector plate 140. Chamber 130, collector plate 140 and mesh filter 144 are isolated from container 150 by insulation 154 (FIG. 2B). Ion beam 120 includes a flux of ions $I_{ion}$ at energy $E_{ion}$ and a flux of neutrals $I_{neutrals}$. Aperture 152 allows beam 120 to pass toward collector plate 140 and the bias applied to chamber 130 allows portions of the collector current to be distinguished, namely the ion current, $I_{ion}$, the secondary electrons generated by ions, and the secondary electrons generated by the neutrals, $I_{neutrals}$.

Chamber 130 is designed to a sufficient length and diameter to direct beam 120 to collector plate 140 while subjecting beam 120 to the electric field produced by biasing chamber 130. Considerations should be made to minimize the completed size of detection structure 108 so that it may fit relatively unobtrusively within a beam-generating device, such as an implanter. For example, chamber 130 may be of a length of about 2" and a diameter of about 1" to provide dimensions for meeting these constraints. Also, chamber 130, collector plate 140, and shield 160 should be made of materials compatible with the environment. For example, chamber 130 and collector plate 140 may be made of aluminum or like material, and shield 60 may be made of graphite or like material.

Figure 3:
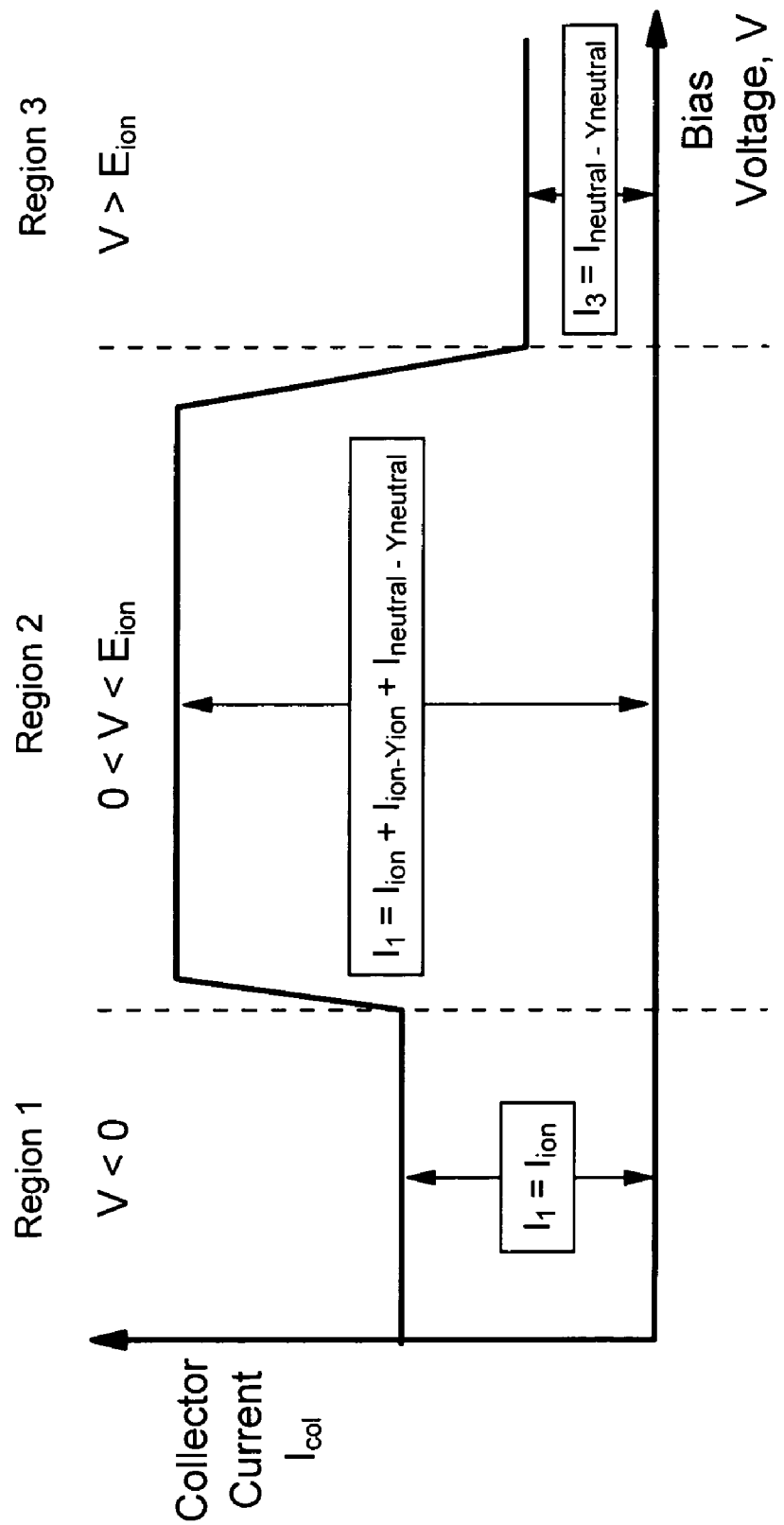
FIG. 3 is a graph of collector current versus bias voltage of a cylinder for an energy contamination monitor according to an embodiment of the preset invention.

The bias voltage (V) applied to chamber 130 may be positive, negative or grounded as illustrated in the graph of FIG. 3. In region 1, a negative bias is applied to chamber 130. In region 1, the measured collector current ($I_{col}$) is due to ions and $I_1 = I_{ion}$. At a sufficiently high voltage in region 3, the measured collector current ($I_{col}$) results from neutrals, and $I_3 = I_{neutral} \gamma_{neutral}$, where $\gamma_{neutral}$ is the secondary electron emission coefficient for neutrals. In region 2, the bias voltage (V) applied to chamber 130 (FIGS. 2A-2B) is positive but less than the voltage applied in region 3, which is required to prevent ions from reaching collector plate 140 (FIGS. 2A-2B). The measured collector current ($I_{col}$) results from both neutrals and ions such that $I_2 = I_{ion} + I_{ion} \gamma_{ion} + I_{neutral} \gamma_{neutral}$, where $\gamma_{ion}$ is the secondary electron emission coefficient for ions.

The currents for each of the operating regions can be manipulated to give:

$$\frac{I_3}{I_2 - I_1 - I_3} = \frac{\gamma_{neutral} I_{neutral}}{\gamma_{ion} I_{ion}}$$

By assuming that the secondary electron emission coefficients for neutrals ($\gamma_{neutral}$) and ions ($\gamma_{ion}$) are the same, the relation is derived:

$$\frac{I_{neutral}}{I_{ion}} = \frac{I_3}{I_2 - I_1 - I_3}$$

Figure 4:
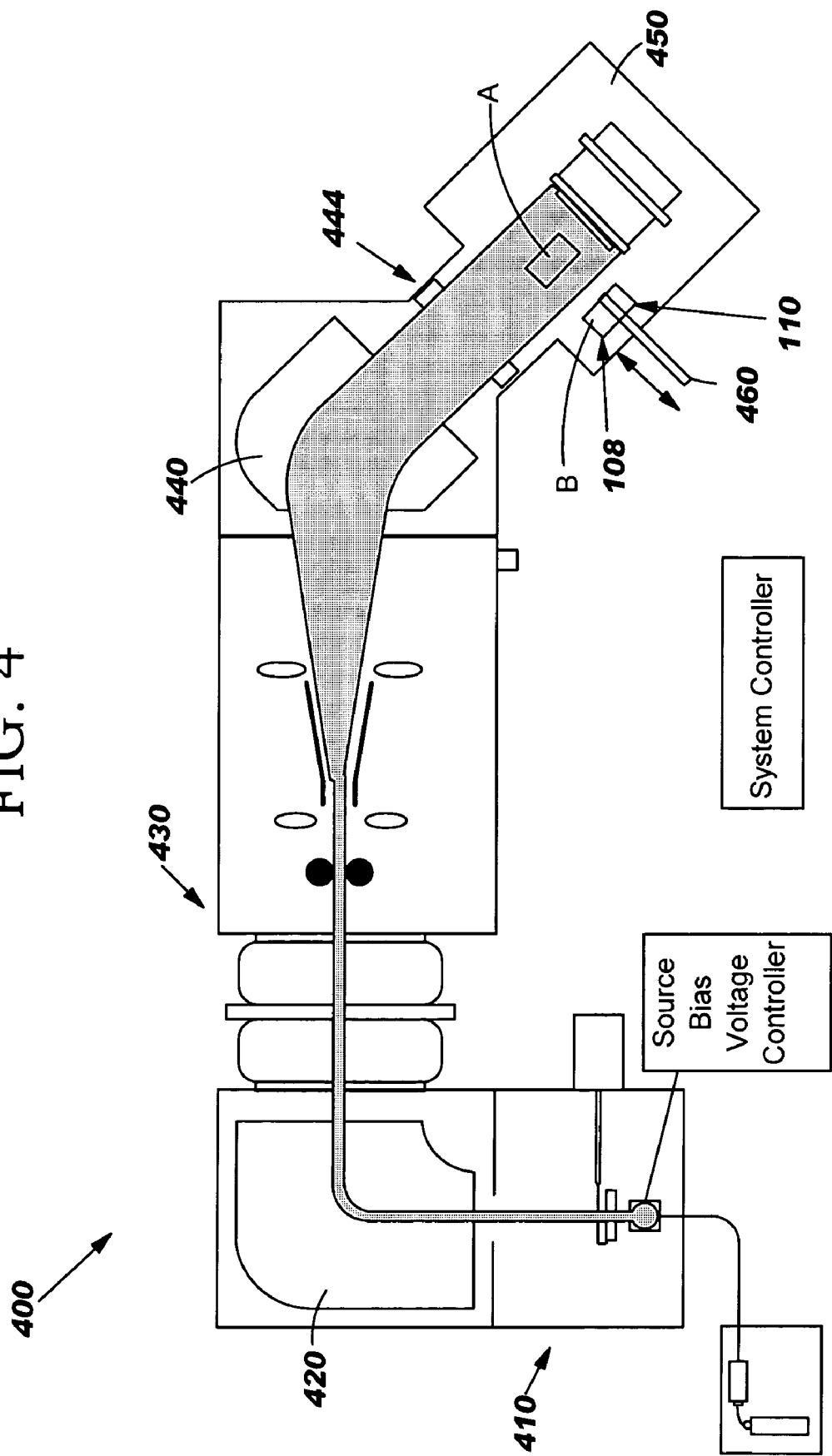
FIG. 4 illustrates an ion implantation system incorporating an energy contamination monitor in an embodiment of the present invention.

As illustrated in FIG. 4, detection structure 108 may be incorporated into an ion implanter system 400 according to an embodiment of the present invention. In this case, ion beam neutral detection system 110 also includes a detector support assembly 460 for moving detection structure 108 between a use position and a non-use position within ion implanter system 400 although configurations may be found that allow the detector to remain in a fixed position. Ion implanter system 400 of the present embodiment includes a source 410 for generating an ion beam. In addition, system 400 may also include a directing magnet 420 of, e.g., 90°, for directing the beam, a deceleration stage 430 for decreasing the energy level of the beam, a corrector magnet 440 for directing the beam, a final stage of deceleration 444 and an end station 450 where the beam is directed to the workpiece. The end station 450 includes detection system 110, which is connected to support system 460, which may include, for example, robotics for moving detection system 110 as generally indicated by the double-ended arrow.

In operation, detection system 110 is moved toward the use position A for obtaining energy contamination measurements during set up, i.e., prior to implanting, or at predetermined intervals (periods). Detection system 110 is moved away from the workpiece to a non-use position B since energy contamination measurements will not be made when the workpiece is being implanted. Periodic detection or measurements of ion beam neutrals in the ion beam during stoppage of ion implanting can then be input into a computer or processor (not shown) for use in optimizing (i.e., through adjustment) the operation of implanter system 400, i.e., prior to implanting or during implanting. For example, if the energy contamination measurements are outside of specification values, implanter system 400 can be re-tuned or stopped until the implanter system 400 is brought back to within the specifications.

The described invention provides process assurance and maximizes implantation productivity when running in deceleration to low energies. Changing conditions in implanter system 400 (FIG. 4), vacuum pressure and maintenance, for example, may lead to differing levels of contamination when running the same recipe. Present practices limit the output of an implanter system to provide some margin for potential changes in operating conditions. Real time detection of energy contamination minimizes contamination due to poor operating conditions and thereby reduces the margin required for safe operation.

Detector system 110 according to the above-described embodiments of the present invention measures the current of secondary electrons emitted due to the impact of the energetic neutral particles. Other neutral detectors could be substituted for the neutral detector based on the same principle or another like calorimetry.

Although the methods and systems have been described above relative to specific embodiments, the present invention is not so limited. Obviously, many modifications and variations may become apparent in light of the teachings. Many additional changes in the details, materials, and arrangement of parts, described and illustrated herein, can be made by those skilled in the art.

What is claimed is:

1. An ion implanter system comprising:
    a source for generating an ion beam for implanting a workpiece; and
    an ion beam neutral detector including;
        a chamber coupled to an adjustable bias voltage source;
        a collector plate disposed adjacent the chamber and configured to receive the ion beam; and
        a measuring device configured to measure a current of the ion beam at the collector plate, wherein different portions of the current are measured at the collector plate depending on a bias voltage provided to the chamber by the adjustable bias voltage source.

2. The ion implanter system of claim 1, wherein the measuring device distinguishes between a secondary electron generated by an ion within the ion beam and a secondary electron generated by a neutral.

3. The ion implanter system of claim 1, wherein the chamber and the collector plate include aluminum.

4. The ion implanter system of claim 1, wherein the chamber is substantially cylindrical.

5. The ion implanter system of claim 1, wherein the ion beam neutral detector further includes a container, wherein the chamber and the collector plate are insulated from the container.

6. The ion implanter system of claim 1, wherein the ion beam neutral detector further includes a mesh filter in front of the collector plate.

7. The ion implanter system of claim 5, further comprising a shield including an aperture for receiving the ion beam, the shield being coupled to the container.

8. The ion implanter system of claim 7, wherein the shield includes graphite.

9. The ion implanter system of claim 1, further comprising: a directing magnet, a deceleration stage, a corrector magnet and a final deceleration stage.

10. The ion implanter system of claim 1, further comprising a detector support assembly for moving the ion beam neutral detector between a use position and a non-use position.

11. A method of implanting a workpiece with an ion implanter system, the method comprising the steps of:
implanting the workpiece using an ion beam; and
periodically detecting ion beam neutrals in the ion beam by passing the ion beam through a chamber coupled to an adjustable bias voltage source and towards a collector plate disposed adjacent the chamber and by measuring a current of the ion beam at the collector plate, wherein different portions of the current are measured at the collector plate depending on a bias voltage provided to the chamber by the adjustable bias voltage source.

12. The method of claim 11, further comprising the step of detecting ion beam neutrals in the ion beam prior to the implanting step.

13. The method of claim 12, further comprising the step of adjusting the ion beam prior to the implanting step.

14. The method of claim 11, further comprising the step of adjusting the ion beam in response to the periodic detection.

15. The method of claim 14, wherein the adjusting step includes adjusting at least one of the ion implanter system and a vacuum pressure.

16. An ion beam neutral detector system comprising: a detection structure including:
a chamber coupled to an adjustable bias voltage source,
a collector plate adjacent the chamber for receiving the ion beam, and
a measuring device that measures a current of the ion beam at the collector plate, wherein different portions of the current are measured at the collector plate depending on a bias voltage provided to the chamber by the adjustable bias voltage source.

17. The system of claim 16, wherein the measuring device distinguishes between a secondary electron generated by an ion within the ion beam and a secondary electron generated by a neutral.

18. The system of claim 16, wherein the chamber and the collector plate include aluminum.

19. The system of claim 16, wherein the chamber is substantially cylindrical.

20. The system of claim 16, wherein the detection structure further includes a container for positioning the chamber and the collector plate, wherein the chamber and the collector plate are insulated from the container.

21. The system of claim 20, further comprising a shield including an aperture for receiving the ion beam, wherein the shield is coupled to the container.

22. The system of claim 21, wherein the shield includes graphite.

23. The system of claim 16, wherein the detection structure further includes a mesh filter in front of the collector plate.

24. The system of claim 16, further comprising a detector support assembly for moving the detection structure between a use position and non-use position within an ion implanter system.

* * * * *